(12) United States Patent
Holweg et al.

(10) Patent No.: US 10,559,519 B2
(45) Date of Patent: Feb. 11, 2020

(54) SERIES CIRCUIT ARRANGEMENT OF POWER SEMICONDUCTORS

(71) Applicant: Siemens Aktiengesellschaft, Munich (DE)

(72) Inventors: Johann Holweg, Zirndorf (DE); Katrin Benkert, Schwaig (DE); Harald Landes, Rückersdorf (DE); André Leonide, Fürth (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 16/075,761

(22) PCT Filed: Jan. 13, 2017

(86) PCT No.: PCT/EP2017/050680
§ 371 (c)(1),
(2) Date: Aug. 6, 2018

(87) PCT Pub. No.: WO2017/133881
PCT Pub. Date: Aug. 10, 2017

(65) Prior Publication Data
US 2019/0043784 A1 Feb. 7, 2019

(30) Foreign Application Priority Data

Feb. 4, 2016 (DE) .................. 10 2016 201 679
Feb. 23, 2016 (DE) .................. 10 2016 202 748

(51) Int. Cl.
*G12B 15/02* (2006.01)
*H02M 5/45* (2006.01)
(Continued)

(52) U.S. Cl.
CPC ............ *H01L 23/473* (2013.01); *G12B 15/02* (2013.01); *H01L 23/367* (2013.01); *H02M 5/45* (2013.01);
(Continued)

(58) Field of Classification Search
CPC ... H01L 23/34; H01L 23/367; H01L 23/3672; H01L 23/3675; H01L 23/3677;
(Continued)

(56) References Cited

U.S. PATENT DOCUMENTS 3,749,981 A * 7/1973 Koltuniak ............. H02B 1/565
  361/696
4,051,509 A  9/1977 Beriger et al. ................ 257/714
(Continued)

FOREIGN PATENT DOCUMENTS

CN  1617660 A   5/2005  ............... H05K 7/20
DE  2501029 A1  6/1976  ........... H01L 23/473
(Continued)

OTHER PUBLICATIONS

German Office Action, Application No. 102016202748.4, 7 pages, dated Nov. 9, 2016.
(Continued)

*Primary Examiner* — Maliheh Malek
(74) *Attorney, Agent, or Firm* — Slayden Grubert Beard PLLC

(57) ABSTRACT

The present disclosure relates to semiconductors. Some embodiments may include a series circuit arrangement of power semiconductors comprising: cooling-water boxes arranged on the semiconductors and electrically connected to them; two cooling-water distributor lines; respective branchings on the cooling-water distributor lines for the cooling chambers; and a control electrode arranged on the cooling-water distributor lines. The cooling chambers are
(Continued)

connected in parallel between the cooling-water distributor lines with respect to a cooling-water stream. The cooling chambers are connected to the branchings via a respective connecting line. For at least some of the cooling chambers, the branchings on the cooling-water distributor lines are arrayed relative to the position of the respective cooling chamber in offset manner in relation to a geometrically shortest possible link to the cooling-water distributor lines, so that a difference of potential between the cooling chambers and the branchings is minimized.

5 Claims, 3 Drawing Sheets

(51) Int. Cl.
| | |
|---|---|
| H02M 7/515 | (2007.01) |
| H02M 7/537 | (2006.01) |
| H05K 7/20 | (2006.01) |
| H01L 23/473 | (2006.01) |
| H01L 23/367 | (2006.01) |
| H02M 7/53854 | (2007.01) |
| F28F 27/02 | (2006.01) |
| H02M 5/44 | (2006.01) |

(52) U.S. Cl.
CPC ......... *H02M 5/4505* (2013.01); *H02M 7/515* (2013.01); *H02M 7/537* (2013.01); *H05K 7/20927* (2013.01); *F28F 27/02* (2013.01); *F28F 2210/02* (2013.01); *F28F 2210/10* (2013.01); *H02M 5/44* (2013.01); *H02M 7/53854* (2013.01)

(58) Field of Classification Search
CPC ..... H01L 23/46; H01L 23/473; H01L 25/072; H01L 2924/00; H01L 2924/0002; H02M 5/44; H02M 5/443; H02M 5/45; H02M 5/4505; H02M 7/003; H02M 7/10; H02M 7/515; H02M 7/537; H02M 7/53854; G12B 15/02; F28F 2210/02; F28F 2210/10; F28F 27/02; H05K 7/20927
See application file for complete search history.

(56) References Cited

U.S. PATENT DOCUMENTS

| | | | | | |
|---|---|---|---|---|---|
| 4,475,152 | A * | 10/1984 | Ikegame | ................ | G12B 15/02 257/E23.098 |
| 4,497,689 | A * | 2/1985 | Szucs | ....................... | B01D 1/22 202/174 |
| 5,565,716 | A * | 10/1996 | Tierney, Jr. | ............. | F28F 27/02 307/149 |
| 6,053,238 | A * | 4/2000 | Goth | ...................... | F28D 1/0477 165/10 |
| 6,185,116 | B1 * | 2/2001 | Åstrom | .............. | H05K 7/20927 361/676 |
| 8,437,113 | B2 * | 5/2013 | Jacobson | .............. | H01L 23/473 361/103 |
| 9,363,930 | B2 * | 6/2016 | Kulkarni | ............ | H05K 7/20936 |
| 2006/0144565 | A1 * | 7/2006 | Tsai | .................... | F28D 15/0233 165/104.26 |
| 2008/0179972 | A1 * | 7/2008 | Aoki | .................... | H01L 21/4878 310/52 |
| 2008/0186751 | A1 * | 8/2008 | Tokuyama | ............ | H01L 23/473 363/131 |
| 2010/0326750 | A1 * | 12/2010 | Murakami | ............ | H01L 23/473 180/65.31 |
| 2011/0273098 | A1 * | 11/2011 | Grajcar | .............. | H05B 33/0809 315/186 |
| 2011/0299265 | A1 * | 12/2011 | Nakatsu | ................ | H02M 7/003 361/820 |
| 2013/0127302 | A1 * | 5/2013 | Benkert | ................ | H01L 41/083 310/366 |
| 2014/0054762 | A1 * | 2/2014 | Nagaune | ............... | H01L 23/473 257/714 |
| 2014/0251585 | A1 * | 9/2014 | Kusuda | ..................... | F28D 1/06 165/164 |
| 2014/0319673 | A1 * | 10/2014 | Zhou | .................. | H01L 23/4334 257/712 |
| 2015/0049527 | A1 * | 2/2015 | Sugahara | ................ | H01L 23/34 363/80 |
| 2016/0091254 | A1 * | 3/2016 | Kawamura | ............ | F28F 13/12 165/166 |
| 2017/0149345 | A1 * | 5/2017 | Boe | .......................... | H01G 4/38 |
| 2017/0241110 | A1 * | 8/2017 | West | ..................... | B01D 5/0012 |
| 2018/0062536 | A1 * | 3/2018 | Mondal | ................. | H02M 7/483 |
| 2019/0043785 | A1 * | 2/2019 | Wang | ................... | H01L 23/473 |
| 2019/0159367 | A1 * | 5/2019 | Umino | .................... | H01L 23/46 |

FOREIGN PATENT DOCUMENTS

| | | | | |
|---|---|---|---|---|
| DE | 102014204241 A1 | | 9/2015 | ............. H02M 1/00 |
| EP | 3046144 A1 * | | 7/2016 | ........... H01L 23/473 |
| EP | 3046144 B1 * | | 9/2017 | ........... H01L 23/473 |
| EP | 3176820 B1 * | | 7/2018 | ............... C09K 5/10 |
| EP | 3379570 A1 * | | 9/2018 | ............. H01L 23/34 |
| JP | 57102061 A | | 6/1982 | ........... H01L 23/473 |
| JP | 57193974 A | | 11/1982 | ........... H01L 23/473 |
| WO | 2017/133881 A1 | | 8/1917 | ............. H01L 23/36 |
| WO | WO-2018197241 A1 * | | 11/2018 | ......... G05D 23/1932 |

OTHER PUBLICATIONS

International Search Report and Written Opinion, Application No. PCT/EP2017/050680, 7 pages, dated Mar. 31, 2017.

* cited by examiner

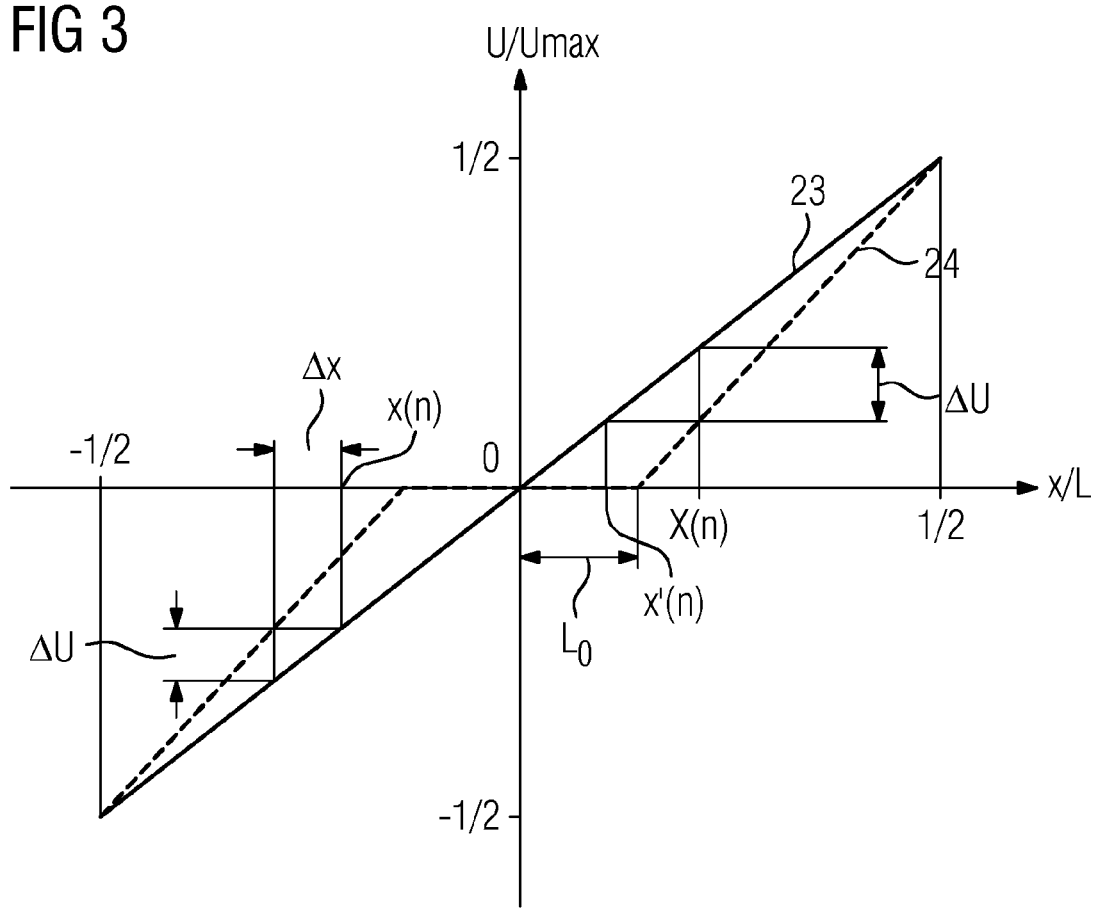

SERIES CIRCUIT ARRANGEMENT OF POWER SEMICONDUCTORS

CROSS-REFERENCE TO RELATED APPLICATIONS

This application is a U.S. National Stage Application of International Application No. PCT/EP2017/050680 filed Jan. 13, 2017, which designates the United States of America, and claims priority to DE Application No. 10 2016 201 679.2 filed Feb. 4, 2016 and DE Application No. 10 2016 202 748.4 filed Feb. 23, 2016, the contents of which are hereby incorporated by reference in their entirety.

TECHNICAL FIELD

The present disclosure relates to semiconductors. Various embodiments may include series circuit arrangements of power semiconductors.

BACKGROUND

In series circuit arrangements of power semiconductors, for instance in so-called high-voltage direct-current transmission converters (HVDC), a cooling circuit is employed. The local potential distribution of a cooling circuit is adapted by control electrodes to the voltage of the electrical components in the immediate surroundings. This is done to prevent partial discharges between the cooling-water-carrying pipelines made of synthetic material and the electrical components. Furthermore, corrosion currents that are brought about by differences of potential between the cooling water and the metallic system components coming into contact with the cooling water are kept down in this manner. Since the control electrodes become coated in the course of time with mechanically hard coverings which can chip off and clog up cooling lines, the control electrodes have to be cleaned or exchanged in the course of the periodic shutdown of the system.

Conventional series circuit arrangements exhibit cooling-water distributor lines, wherein, starting from a cooling-water inlet or cooling-water outlet, submodules of series circuits are arranged on both sides and a region around the cooling-water inlet is, for structural reasons, as a rule not equipped with corresponding power-semiconductor devices and cooling chambers. For the purpose of controlling the potential in each of these submodules, two control electrodes are ordinarily provided respectively in each submodule on both sides of the cooling-water inlet and cooling-water outflow, said electrodes being connected to the first cooling chambers on both sides, so that the potential in the interspace—that is to say, in the region of the inlet—is kept at the mean value of the potentials at the ends of the distributor. Consequently, in a conventional series circuit arrangement four control electrodes are provided in each instance per cooling-water distributor line—that is to say, with reference to two cooling-water distributor lines in each instance, a total of eight control electrodes.

SUMMARY

The teachings of the present disclosure may be useful in reducing the number of control electrodes in a series circuit arrangement of power semiconductors, and consequently in saving costs for the servicing effort. For example, some embodiments include a series circuit arrangement of power semiconductors (4) with a cooling-water distribution apparatus (2), including cooling-water boxes (6) arranged on the power semiconductors (4), which are connected to the power semiconductors (4) in electrically conducting manner. There are also at least two cooling-water distributor lines (8, 9), wherein a first cooling-water distributor line (8) exhibits a cooling-water inlet (18), and a second cooling-water distributor line exhibits a cooling-water outflow (20), and wherein the cooling chambers (6) are connected in parallel between the cooling-water distributor lines (8, 9) with respect to a cooling-water stream (10), and in each instance a branching (12) on the cooling-water distributor lines (8, 9) is provided for the cooling chambers (6) and the cooling chambers (6) are connected to the branchings (12) via a respective connecting line (14), wherein furthermore a control electrode (16) is arranged on the cooling-water distributor lines (8, 9), terminally in each instance, characterized in that for at least some of the cooling chambers (6) the branchings on the cooling-water distributor lines (8, 9) are arranged relative to the position of the respective cooling chamber (6) in offset manner in relation to a geometrically shortest possible link (22) to the cooling-water distributor lines (8, 9), so that a difference of potential (ΔU) between the cooling chambers and the branchings is minimized.

In some embodiments, the cooling-water inlet (18) and the cooling-water outflow (20) are arranged centrically on the cooling-water distributor lines (8, 9) with respect to the control electrodes (16), and branchings (12) of the cooling chambers (6) on the cooling-water distributor line (8, 9) are arranged in offset manner with respect to the cooling chambers (6) in the direction of the cooling-water inlet (18) or the cooling-water outflow (20).

In some embodiments, a first branching (13) for a first cooling chamber (7) is positioned in the region of the cooling-water inlet (18).

In some embodiments, the cooling-water distributor lines (8, 9) are free from further control electrodes.

As another example, some embodiments include a cooling-water distribution apparatus as described above, characterized in that a spacing $L_0$ denotes the spacing between the cooling-water inlet (18) and the first cooling chamber (7), and a spacing $L_1$ denotes the constant spacing of all the other cooling chambers (6) from one another, in which connection the numeral n denotes the serial number of the cooling chambers (6, 7), which begins with 0, and $n_{max}$ is the total number of power semiconductors (4) between the cooling-water inflow (18) and a control electrode (16), wherein the spacing of the branching (12) of the nth cooling chamber (6) from cooling-water inflow results by virtue of the relationship $n(L_0/n_{max}+L1)$.

BRIEF DESCRIPTION OF THE DRAWINGS

Further embodiments and further features are described in more detail on the basis of the following figures. These figures show exemplary embodiments which do not constitute a restriction of the range of protection. The same reference symbols are used for features having the same designation but in a different embodiment.

Shown are:

FIG. 3 a graphical representation of the progression of potential in the cooling-water distribution apparatus, according to the teachings herein.

DETAILED DESCRIPTION

Figure 1:
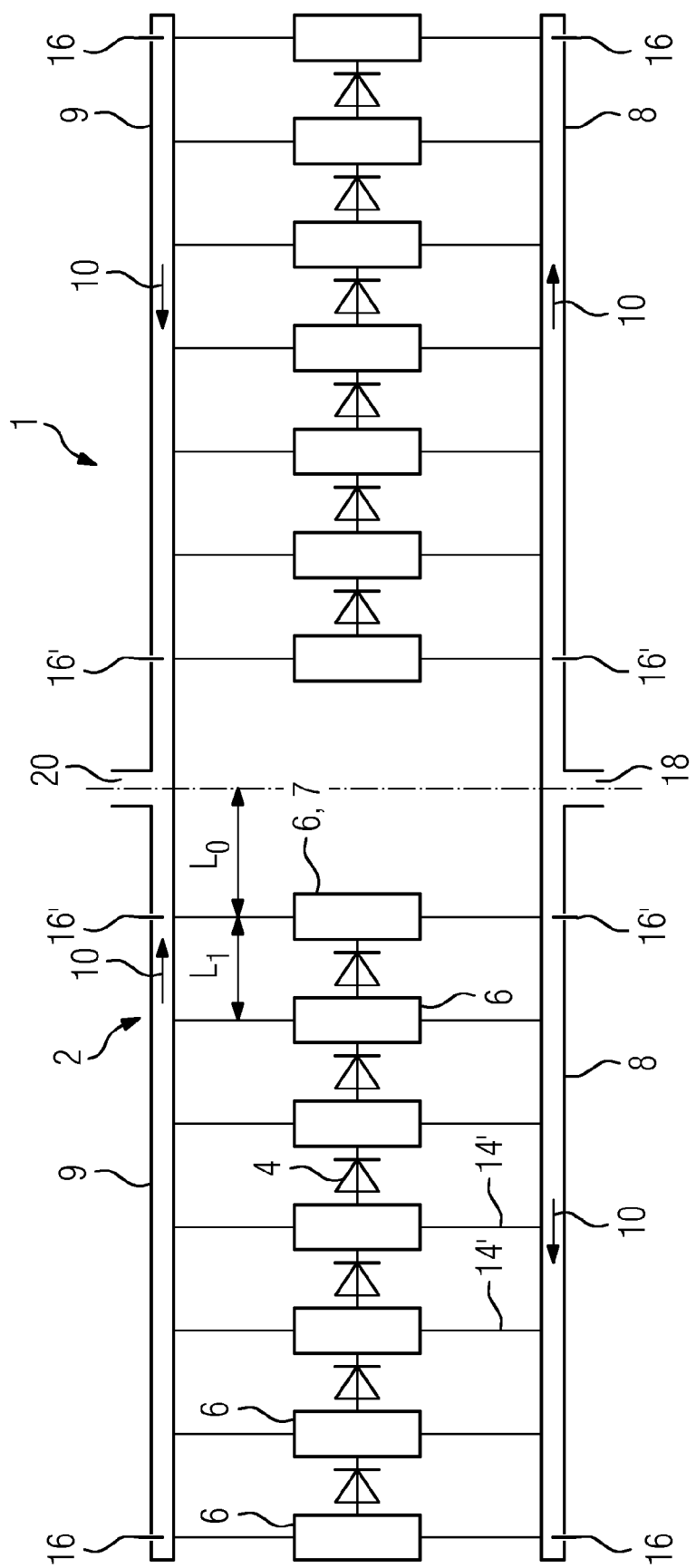
FIG. 1 a series circuit arrangement according to the state of the art.

The series circuit arrangement of power semiconductors as claimed in claim 1 exhibits a cooling-water apparatus which, in turn, includes cooling chambers on which power semiconductors are arranged. In some embodiments, these cooling chambers are connected to the power semiconductors in electrically conducting manner, and they serve for cooling these power semiconductors, in that a cooling medium, in particular cooling water, is passed through the cooling chambers. In some embodiments, the cooling-water distribution apparatus includes at least two cooling-water distributor lines, a first cooling-water distributor line exhibiting a cooling-water inlet, and a second cooling-water distributor line exhibiting a cooling-water outflow.

The cooling chambers are connected in parallel between the cooling-water distributor lines with respect to a stream of cooling water, and for each cooling chamber on each of the two cooling-water distributor lines a branching is provided, via which a connecting line leads to the cooling chamber. In some embodiments, a control electrode is arranged in the cooling-water distributor lines, terminally in each instance. Since each cooling-water distributor line has two ends, two control electrodes are provided for each of these distributor lines.

In some embodiments, for at least some of the cooling chambers, the branchings on the cooling-water distributor lines are arranged relative to the position of the respective cooling chamber in offset manner in relation to a geometrically shortest possible link to the cooling-water distributor lines, so that a difference of potential between the cooling chambers and the branchings is minimized. In comparison with the state of the art, the described series circuit arrangement exhibits only two control electrodes per cooling-water distributor line. Per series circuit arrangement, the number of control electrodes is halved in comparison with the state of the art, for which reason the effort and the costs for the servicing and the maintenance of the control electrodes are also considerably reduced.

In some embodiments, the cooling-water inlet and the cooling-water outflow are arranged concentrically on the cooling-water distributor line with respect to the control electrodes. The branchings of the cooling chambers on the cooling-water distributor lines are arranged in this embodiment in offset manner with respect to the respective cooling chamber in the direction of the cooling-water inlet or the cooling-water outlet. In this case it may, in addition, be expedient that a first branching of a first cooling chamber has been positioned directly in the region of the cooling-water inlet, since the potential of the two central cooling chambers arises at this point. In some embodiments, by virtue of the described arrangement of the offset branchings from connecting lines to the cooling chambers, the cooling-water distributor lines are free from further control electrodes, except those positioned at the end of the distributor lines.

The suitable spacing between the cooling-water inlet and the branching to a respective cooling chamber can be ascertained by the following relationship:

$$n(L_0/n_{max}+L1)$$

In this relationship, spacing $L_0$ is the spacing between the cooling-water inlet and a first cooling chamber, spacing $L1$ denotes the constant spacing of all the other cooling chambers from one another, and the numeral n is the serial number of the cooling chambers, the first cooling chamber beginning with 0, and $n_{max}$ representing the total number of semiconductors between the cooling-water inflow and the terminally arranged control electrode. By virtue of this formula, a discrete value is determined that is based upon a derivation from the values $L_0$ and $L1$ according to the state of the art and the number of cooling chambers. This value is suitable for approximating to the actual, optimal branching-point. In principle, the same effect is obtained if the spacing between the terminal control electrode and the cooling-water inflow (corresponds in the state of the art to the spacing $n_{max}*L_1+L_0$) is subdivided into $n_{max}$ sections of equal length. In principle, it is expedient subsequently to ascertain the optimal potential in the vicinity of this point by measurement. In principle, the specified value is based upon measured values and is correspondingly subject to a deviation of ±5%, so that the corresponding branching lies within the stated interval around the ascertained value.

In FIG. 1 a representation is given of a conventional series circuit arrangement of power semiconductors. Here it is a question of a thyristor circuit for a high-voltage direct-current transmission system (HVDC system). In this case, cooling-water distributor lines 8 and 9 are provided, distributor line 8 exhibiting a cooling-water inlet 18, and distributor line 9 exhibiting a cooling-water outflow 20. With respect to a cooling-water stream 10, cooling chambers 6 are connected in parallel in the cooling-water distribution apparatus 2. The cooling chambers 6 are, in turn, connected in series to power semiconductors 4 in electrically conducting manner. Control electrodes 16 are provided at the respective ends of the cooling-water distributor lines 8 and 9. The control electrodes 16 serve to prevent partial discharges between the corresponding pipelines, in particular the cooling-water distributor lines 8 and 9 and also the connecting lines 14' and the cooling chambers 6. Furthermore, the control electrodes serve to keep corrosion damage as low as necessary that may arise by virtue of differences of potential between the cooling water and the metallic system components such as, for example, the aluminum of the cooling chambers 6.

In some embodiments, in addition to the terminal control electrodes 16, central control electrodes 16' are provided in the state of the art, which may be arranged at the branching from the cooling-water distributor line 8, 9 to the respectively first cooling chamber 7. The setting of the potential in the cooling-water circuit is then undertaken in such a way that the maximal or minimal potential obtains at the terminal control electrodes 16, and the mean value of these potentials obtains at the central control electrodes 16'. Consequently, the entire region between the central electrodes 16' is likewise at this mean value of the potential.

Figure 2:
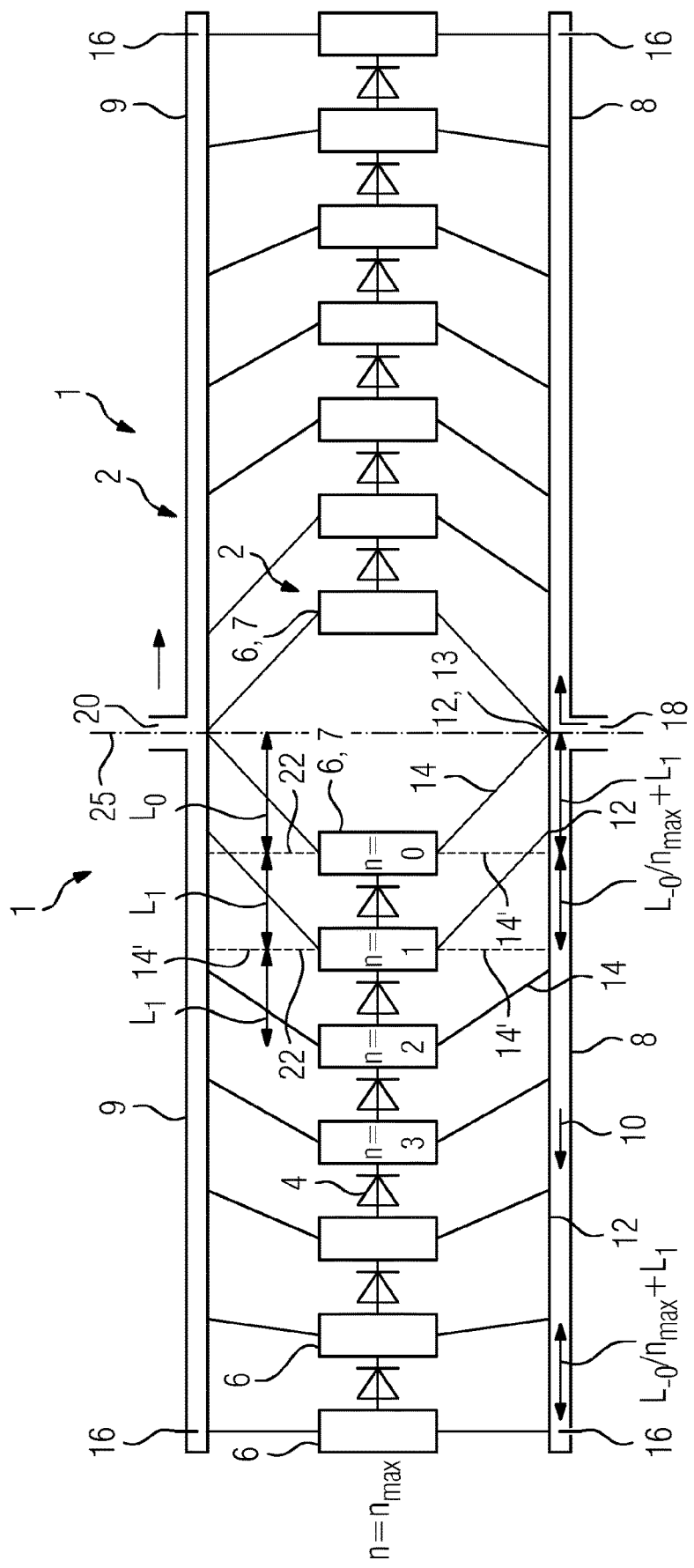
FIG. 2 a series circuit arrangement of power semiconductors with a cooling-water apparatus having a branchings/connections, changed in comparison with the state of the art, between the cooling-water line and the cooling chambers, according to the teachings herein.

The series circuit arrangement described in FIG. 2, with a cooling apparatus, is largely configured analogously to the arrangement according to FIG. 1 and to the state of the art, but it exhibits two substantial differences. On the one hand, the central control electrodes 16' are dispensed with, for which reason the arrangement described here exhibits merely the terminal control electrodes 16. Furthermore, the branchings 12 and the associated connecting lines 14 leading to the cooling chambers 6 are arranged in partially offset manner relative to the position of the respective cooling chamber 6. The offset can be seen with respect to a geometrically shortest possible link 14' to the associated cooling chambers 6, which in the representation has been drawn, in exemplary manner and not fully, by a dashed line.

This measure—that is to say, offsetting of the branchings 12 on the cooling-water distributor line 8 and 9—has the effect that the difference of potential in the connecting hose between the respective cooling chamber 6 and 7 and the branch-point on the cooling-water distributor line is minimized or disappears. To do this, it is expedient to position a branching 13 for a first cooling chamber 7 directly at the region of the cooling-water inflow, at which the mean value of the potential prevails, as will be shown below in connection with the elucidation of FIG. 3. The spacings between the further branchings 12 now occur equidistantly as far as the terminal control electrode 16 and the branching, likewise positioned there, to the last cooling chamber $n_{max}$. This equidistant spacing between the branchings 12 can be ascertained by the relationship $L_0/n_{max}+L1$. In this relationship, length $L_0$ is the spacing between the first cooling chamber 7 and an imaginary mid-perpendicular of the cooling-water distributor lines 8 and 9, which is provided with reference symbol 25. Spacing $L_1$ is the equidistant spacing between the individual cooling chambers 6. In order to ascertain the branching-point 12, starting from the mid-perpendicular 20 on the cooling-water distributor line 8 and 9, the stated expression still has to be multiplied by the serial number n of the cooling chambers, in which connection the first cooling chamber 7 is given the value n=0, the following box is given the value n=1.

In FIG. 3 a progression of voltage curves 23 and 24 is specified in exemplary manner, wherein the X-axis represents the coordinate along the cooling-water distributor line 8 and 9, measured in a unit that is equal to the length of this line. And the origin of the X-axis coincides with the mid-perpendicular 25 in FIG. 2. On the Y-axis the voltage has been plotted in units of Umax, the total voltage of the thyristor chain.

The straight line 23, which passes through the origin of the coordinate system, shows the potential curve in the cooling-water distributor between the two control electrodes 16 which are arranged, in each instance terminally, on each of the cooling-water distributor lines 8 or 9. Curve 24, which is represented by a dashed line, shows the potential progression in the series circuit of the semiconductor devices 4, wherein the maximum value and the minimum value respectively specify the voltage at the respectively outermost cooling chamber $n_{max}$. Strictly speaking, this curve actually extends in the form of a staircase, since the potential across the thickness of a cooling chamber is constant and jumps to the value of the adjacent cooling chamber only in the depletion layer of the semiconductor device. The location at which curve 23 reaches the y-value zero reflects the location X' (0) of the first cooling chamber 7, which is at the mean value of the voltage of the thyristor chain. From the graph it can be discerned on the basis of curve 23 that in the case of an equal spacing from the mid-perpendicular 25 in the cooling-water distributor lines 8 and 9 a different potential obtains than at the associated cooling chamber n or at the associated halves of the adjacent semiconductor devices. This difference is represented graphically by the line $\Delta U$. If it is desired to ensure that the difference in voltage at the connecting hose between the cooling-water distributor branch and the cooling chamber disappears, the hose branch has to be placed at the x-coordinate of that point on curve 23 which possesses the potential of cooling chamber n. In this way, the point X' (n) is obtained at which the branching 12 has to be arranged on the distributor line 8, 9 in order that this point has the same potential as the associated cooling chamber 6 at location X(n). The spacing $\Delta X$, which is represented on the left side in the negative X-range of the graph, is then the spacing by which the branching 12 has to be shifted in the direction of the midpoint of the cooling-water distributor—that is to say, in the direction of the dashed line 25—to be specific, measured from the location of the cooling-water distributor 8 and 9 that has the smallest spacing from the corresponding cooling chamber 6.

What is claimed is:

1. A series circuit arrangement of power semiconductors, the series circuit comprising:
    a cooling water distribution apparatus including cooling-water boxes arranged on the power semiconductors;
    wherein the cooling-water boxes are connected to the power semiconductors in electrically conducting manner; and
    two cooling-water distributor lines;
    wherein a first cooling-water distributor line includes a cooling-water inlet; and
    a second cooling-water distributor line includes a cooling-water outflow;
    wherein cooling chambers are connected in parallel between the cooling-water distributor lines with respect to a cooling-water stream; and
    respective branchings on the cooling-water distributor lines for the cooling chambers;
    wherein the cooling chambers are connected to the branchings via a respective connecting line; and
    a control electrode arranged on the cooling-water distributor lines, terminally in each instance;
    wherein, for at least some of the cooling chambers, the branchings on the cooling-water distributor lines are arrayed relative to the position of the respective cooling chamber in offset manner in relation to a geometrically shortest possible link to the cooling-water distributor lines, so that a difference of potential between the cooling chambers and the branchings is minimized.

2. The series circuit arrangement as claimed in claim 1, wherein the cooling-water inlet and the cooling water outflow are arranged concentric to the cooling-water distributor lines with respect to the control electrodes; and
    branchings are arranged in offset manner with respect to the cooling chambers in the direction of the cooling-water inlet or the cooling-water outflow.

3. The series circuit arrangement as claimed in claim 1, wherein a first branching for a first cooling chamber is positioned in the region of the cooling-water inlet.

4. The series circuit arrangement as claimed in claim 1, wherein the cooling water distributor lines are free from further control electrodes.

5. A cooling-water distribution apparatus as claimed in claim 1, including a first spacing ($L_0$) between the cooling water inlet and the first cooling chamber, and a second spacing (L1) represents a constant spacing of all the other cooling chambers from one another;
    wherein the numeral n represents a serial number of the cooling chambers beginning with 0, and $n_{max}$ represents the total number of power semiconductors between the cooling-water inflow and a control electrode; and
    the spacing of the branching of the nth cooling chamber from cooling-water inflow results by virtue of the relationship $n(L_0/n_{max}+L1)$.

* * * * *